(12) United States Patent
Wen (10) Patent No.: US 11,632,087 B2
(45) Date of Patent: *Apr. 18, 2023

(54) HIGH-LINEARITY AMPLIFIER

(71) Applicant: MEDIATEK INC., Hsinchu (TW)

(72) Inventor: Sung-Han Wen, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/840,874

(22) Filed: Jun. 15, 2022

(65) Prior Publication Data

US 2022/0321064 A1    Oct. 6, 2022

Related U.S. Application Data

(63) Continuation of application No. 17/068,034, filed on Oct. 12, 2020, now Pat. No. 11,394,351.

(Continued)

(51) Int. Cl.
*H03F 1/32* (2006.01)
*H03F 1/34* (2006.01)

(52) U.S. Cl.
CPC .............. *H03F 1/34* (2013.01); *H03F 1/3211* (2013.01); *H03F 2203/45601* (2013.01)

(58) Field of Classification Search
CPC ..................... H03F 1/34; H03F 1/3211; H03F 2203/45601; H03F 1/083; H03F 2203/45528; H03F 3/45475; H03F 3/45

(Continued)

(56) References Cited

U.S. PATENT DOCUMENTS 3,934,201 A    1/1976  Majefski
4,716,398 A   12/1987  Eccleston et al.
(Continued)

FOREIGN PATENT DOCUMENTS

CN    201726369 U    1/2011
CN    205812326 U   12/2016
(Continued)

OTHER PUBLICATIONS

Rueger, T., et al.; "A 110dB Ternary PWM Current-Mode Audio DAC with Monolithic 2Vrms Driver;" IEEE International Solid-State Circuits Conference; Feb. 2004; pp. 1-10.

(Continued)

*Primary Examiner* — Hieu P Nguyen
(74) *Attorney, Agent, or Firm* — McClure, Qualey & Rodack, LLP (57) ABSTRACT

A high-linearity amplifier including a main operational amplifier, a feedback circuit, and a compensation circuit is shown. The feedback circuit couples an output signal of the main operational amplifier to an input port of the main operational amplifier. The compensation circuit couples a former-stage circuit of the amplifier to the input port of the main operational amplifier to compensate for the non-linearity of the feedback circuit. The compensation circuit and the feedback circuit form an inverse paralleling linearization architecture. In the inverse paralleling linearization architecture, a resistor in the feedback circuit corresponds to a resistor in the compensation circuit which is biased in an inversed way in comparison with the corresponding resistor in the feedback circuit.

12 Claims, 6 Drawing Sheets

Related U.S. Application Data (60) Provisional application No. 62/937,282, filed on Nov. 19, 2019.

(58) Field of Classification Search
USPC .................................................. 330/252–261
See application file for complete search history.

(56) References Cited

U.S. PATENT DOCUMENTS

| | | |
|---|---|---|
| 4,899,115 A | 2/1990 | Christian |
| 5,008,634 A | 4/1991 | Christian |
| 5,022,305 A | 6/1991 | Butler |
| 5,133,014 A | 7/1992 | Pritchard |
| 5,459,531 A | 10/1995 | Park |
| 5,635,874 A | 6/1997 | Perrot |
| 5,636,284 A | 6/1997 | Pritchard |
| 5,761,317 A | 6/1998 | Pritchard |
| 5,808,516 A | 9/1998 | Barber |
| 5,848,165 A | 12/1998 | Pritchard |
| 7,633,342 B2 | 12/2009 | Fong et al. |
| 7,825,735 B1 | 11/2010 | Wessendorf |
| 8,259,821 B2 | 9/2012 | Hauptmann et al. |
| 9,008,333 B2 | 4/2015 | Quilter |
| 9,172,354 B2 * | 10/2015 | Ciubotaru .......... H03H 11/0405 |
| 10,211,865 B1 | 2/2019 | Miller et al. |
| 10,243,574 B2 | 3/2019 | Kauffman et al. |
| 2005/0271161 A1 | 12/2005 | Staszewski et al. |
| 2015/0268729 A1 | 9/2015 | Cehelnk |
| 2018/0248527 A1 | 8/2018 | McLachlan et al. |
| 2019/0267949 A1 | 8/2019 | Chen et al. |

FOREIGN PATENT DOCUMENTS

| | | |
|---|---|---|
| DE | 10 2016 012 751 B3 | 2/2018 |
| EP | 1 170 858 A2 | 1/2002 |
| EP | 2 937 996 A2 | 10/2015 |
| TW | I328342 B | 8/2010 |
| WO | 94/16494 A1 | 7/1994 |

OTHER PUBLICATIONS

European Search Report dated Apr. 7, 2021, issued in application No. EP 20205039.9.

Chinese language office action dated May 6, 2021, issued in application No. TW 109138225.

Zumbahlen, H.; "Linear Circuit Design Handbook;" Dec. 2008; pp. 1-234.

* cited by examiner

HIGH-LINEARITY AMPLIFIER

CROSS REFERENCE TO RELATED APPLICATIONS

This application is a Continuation of U.S. patent application Ser. No. 17/068,034, filed Oct. 12, 2020 and entitled "High-Linearity Amplifier", now U.S. Pat. No. 11,394,351, which claims the benefit of provisional Application No. 62/937,282, filed Nov. 19, 2019, the entirety of which is incorporated by reference herein.

BACKGROUND OF THE INVENTION

Field of the Invention

The present invention relates to operational amplifiers.

Description of the Related Art

Operational amplifiers (op amps) are among the most widely used electronic devices today, being used in a vast array of consumer, industrial, and scientific devices. For example, a headphone amplifier may be implemented using an operational amplifier.

Figure 1:
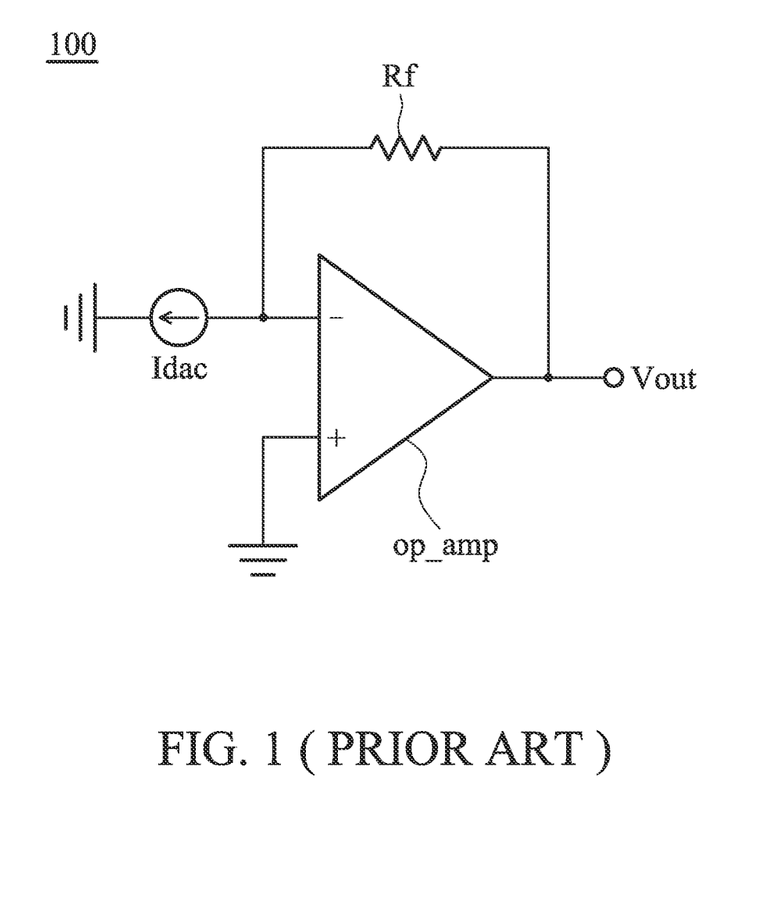
FIG. 1 depicts a conventional amplifier 100 implemented by an operational amplifier op_amp.

FIG. 1 depicts a conventional amplifier 100 implemented by an operational amplifier op_amp. Due to the velocity saturation effect, the resistance of the feedback resistor Rf is seriously affected (e.g., 2nd-order voltage coefficient in the resistance of the feedback resistor Rf) by a large voltage swing across the feedback resistor Rf, which results in serious odd harmonics (e.g., HD3, HD5, HD7, and so on) in the amplification.

One conventional solution is to use a large-sized feedback resistor Rf to sustain the large voltage swing. However, the improvement is not efficient. The width of the feedback resistor Rf is increased by $2^N$ times, the third-order harmonic HD3 is only improved by N*12 dB. Targeted at −130 dBc third-order harmonic (HD3), the feedback resistor Rf is too huge in size. The circuit size of the entire amplifier is very large.

BRIEF SUMMARY OF THE INVENTION

A reasonable-sized amplifier with high-linearity is introduced.

A high-linearity amplifier including a main operational amplifier, a feedback circuit, and a compensation circuit is shown. The feedback circuit couples an output signal of the main operational amplifier to an input port of the main operational amplifier. The compensation circuit couples a former-stage circuit of the amplifier to the input port of the main operational amplifier to compensate for the non-linearity of the feedback circuit. The compensation circuit and the feedback circuit form an inverse paralleling linearization architecture. In the inverse paralleling linearization architecture, a resistor in the feedback circuit corresponds to a resistor in the compensation circuit which is biased in an inversed way in comparison with the corresponding resistor in the feedback circuit.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 2A:
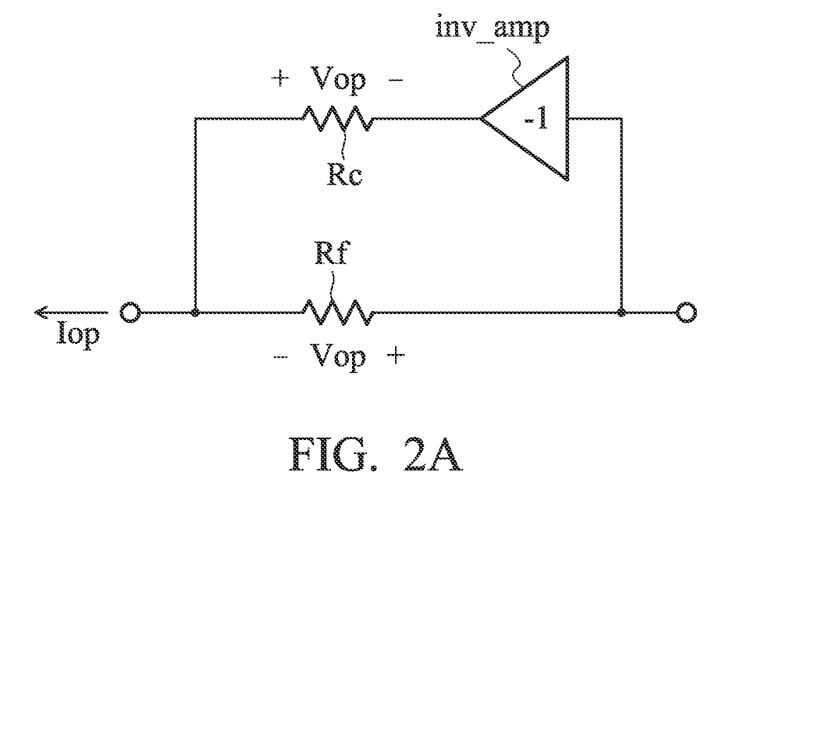
FIG. 2A and FIG. 2B depict a solution to the non-linearity of the feedback resistor Rf of FIG. 1, wherein an inverse paralleling linearization architecture is introduced.
Figure 2B:
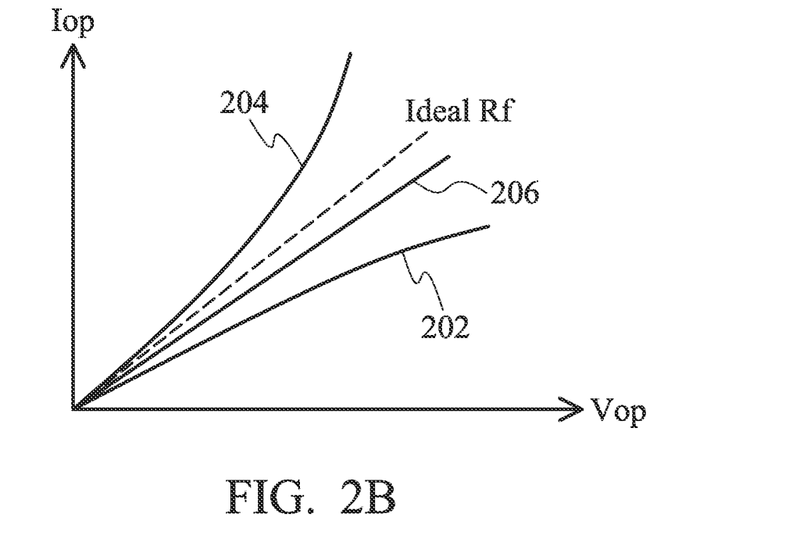

FIG. 2A and FIG. 2B depict a solution to the non-linearity of the feedback resistor Rf of FIG. 1. An inverse paralleling linearization architecture is introduced.

Referring to FIG. 2A, the voltage Vop across the feedback resistor Rf is inverted by an inverting amplification circuit inv_amp (with an amplitude gain 1) and thereby the voltage across a compensation resistor Rc is in an inverse phase (Vop) compared to the voltage (+Vop) across the feedback resistor Rf. Such architecture is named the inverse paralleling linearization. FIG. 2B shows the current-voltage (I-V) plot of the resistors of FIG. 2B. The I-V plot of the feedback resistor Rf is 202, which contains a 2nd-order degradation, e.g., $Rf(1-a_{(2,\,Rf)}Vop^2)$, where $a_{(2,\,Rf)}$ is the 2nd-order non-linearity voltage coefficient of the feedback resistor Rf. The I-V plot of the compensation resistor Rc is 204, whose 2nd-order harmonic is in another direction, e.g., $Rc(1+a_{(2,\,Rc)}Vop^2)$, where $a_{(2,\,Rc)}$ is the 2nd-order non-linearity voltage coefficient of the compensation resistor Rc. According to the inverse paralleling linearization architecture of FIG. 2A, the I-V plot of the equivalent resistance is 206, which approaches the ideal feedback resistor Rf.

The inverse paralleling linearization architecture may be implemented in a positive feedback loop path of an amplifier.

Figure 3:
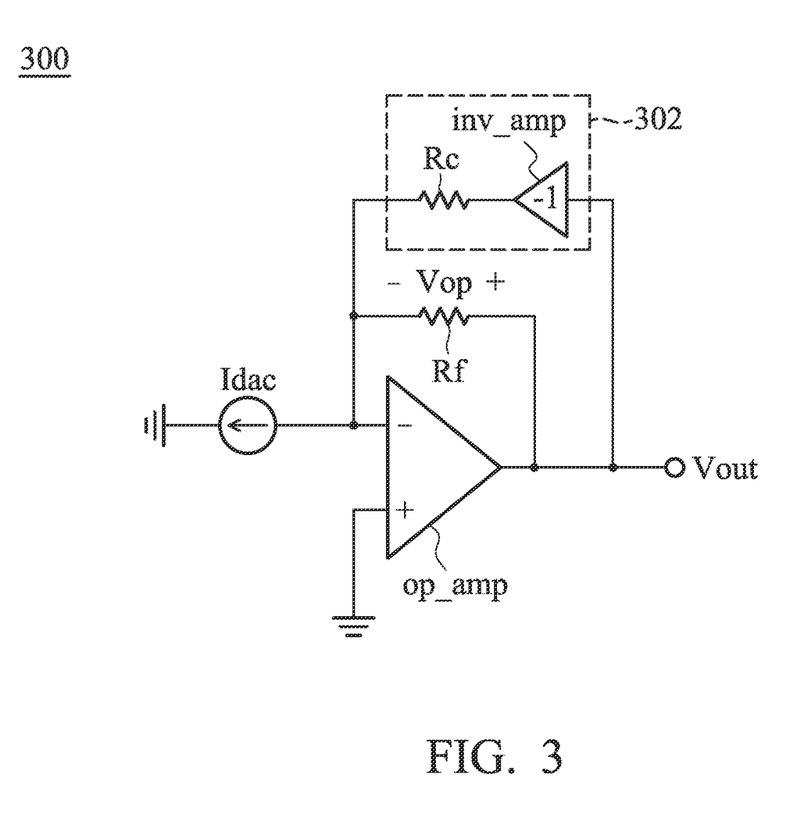
FIG. 3 depicts a single-ended amplifier 300 with the inverse paralleling linearization in a positive feedback loop path.

FIG. 3 depicts a single-ended amplifier 300 with the inverse paralleling linearization in a positive feedback loop path.

The single-ended amplifier 300 has a main operational amplifier op_amp, a feedback resistor Rf, and a compensation circuit 302 including a compensation resistor Rc and an inverting amplification circuit inv_amp (with an amplitude gain 1). The main operational amplifier op_amp has a non-inverting input terminal '+', an inverting input terminal '−', and a single-ended output terminal outputting the amplified signal Vout. The feedback resistor Rf is coupled between the single-ended output terminal (Vout) and the inverting input terminal '−' of the main operational amplifier op_amp. The compensation circuit 302 is provided in the positive feedback loop path of the single-ended amplifier 300 to form an inverse paralleling linearization architecture with the feedback resistor Rf. Thus, non-linearity of the feedback resistor Rf is compensated by the compensation circuit 302. As shown, the single-ended output terminal (Vout) of the main operational amplifier op_amp is coupled to an input terminal of the inverting amplification circuit inv_amp, an output terminal of the inverting amplification circuit inv_amp is coupled to the inverting terminal '−' of the main operational amplifier op_amp through the compensation resistor Rc.

The single-ended amplifier 300 is an I-V amplifier, whose input signal is a current signal Idac and output signal is a voltage signal Vout. In the other exemplary embodiments, V-V amplification can also use the compensation circuit 302.

In the inverse paralleling linearization architecture, the output signal Vout is:

$$\begin{aligned}
Vout &\approx IdacRf(1-a_{(2,Rf)}Vop^2) + VoutRf(1-a_{(2,Rf)}Vop^2)/[Rc(1-a_{(2,Rc)}Vop^2)] \\
&\approx IdacRf(1-a_{(2,Rf)}Vop^2) + VoutRf(1-a_{(2,Rf)}Vop^2)/Rc*(1+a_{(2,Rc)}Vop^2) \\
&\qquad \text{(due to Taylor series)} \\
&\approx IdacRf(1-a_{(2,Rf)}Vop^2) + (VoutRf/Rc(1-a_{(2,Rf)}Vop^2+a_{(2,Rc)}Vop^2) \\
&\approx IdacRf + VoutRf/Rc \qquad \text{(if } a_{(2,Rc)} = (1+IdacRc/Vout)*a_{(2,Rf)}) \\
&\approx IdacRf \qquad \text{(if } Rc \gg Rf)
\end{aligned}$$

To achieve the ideal equation Vout≈IdacRf, the resistance of the compensation resistor Rc is greater than the resistance of the feedback resistor Rf.

In an exemplary embodiment, the resistance of the compensation resistor Rc is N times the resistance of the feedback resistor Rf, and N is greater than 1. The length and width of the feedback resistor Rf are L1 and W1, respectively. The length and width of the compensation resistor Rc are L2 and W2, respectively. Specifically, the design of the compensation resistor Rc is:

$L2=L1/\sqrt{N}$, and $W2=W1/(N\cdot\sqrt{N})$

The size of the compensation resistor Rc is smaller than the size of the feedback resistor Rf. The single-ended amplifier 300 is a reasonable-sized amplifier with high-linearity.

In an exemplary embodiment, to perfectly minimize the noise contribution or instability introduced through the positive feedback loop path, N is greater than 10. For example, N may be 29. When W1 is 32μ and L1 is 189μ, W2 is 0.2φ and L2 is 35.1μ. Both feedback resistor Rf and the compensation resistor Rc are small-sized resistors.

In another exemplary embodiment, the inverting amplification circuit inv_amp of the compensation circuit 302 may have a magnitude gain k greater than 1. In such an example, the resistance of the compensation resistor Rc is k*N times the resistance of the feedback resistor Rf, and N is greater than 1. Specifically, the design of the compensation resistor Rc is:

$L2=L1/\sqrt{k\cdot N}$, and $W2=W1/(k\cdot N\cdot\sqrt{k\cdot N})$

The size of the compensation resistor Rc is further shrunk by k. In the example wherein N is 29, W1 is 32μ, L1 is 189μ, and k is 2, W2 is 0.072μ and L2 is 24.8μ. The size of compensation resistor Rc is smaller than the forgoing example.

In the other exemplary embodiments, the feedback resistor Rf is also manufactured in a small size. For example, the feedback resistor Rf may be implemented by multiple small-sized resistors which are coupled in parallel.

Figure 4:
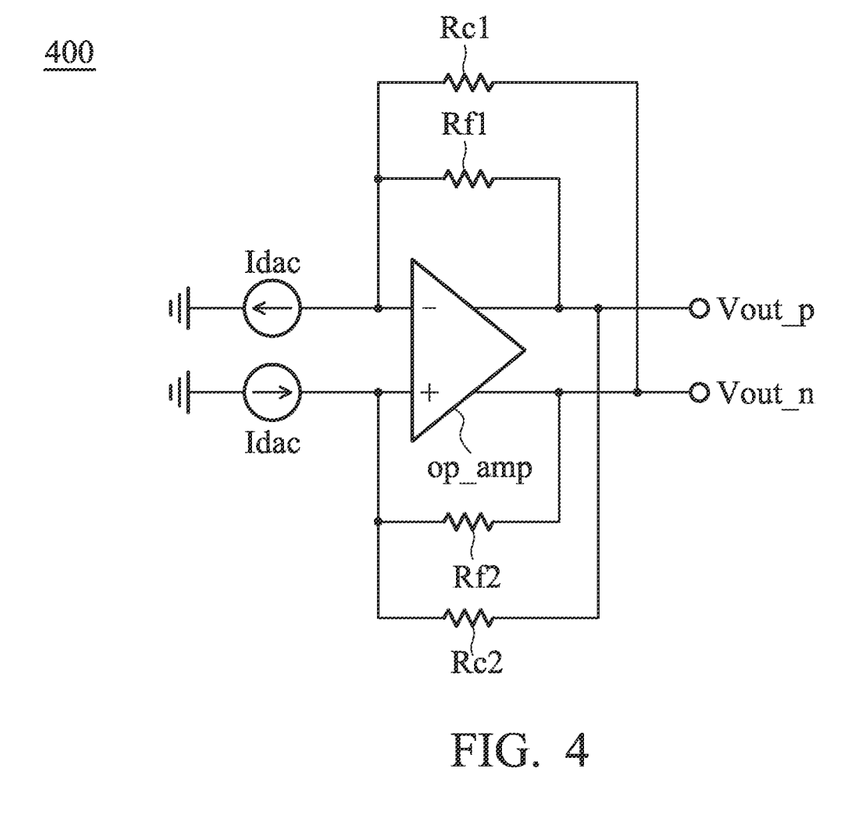
FIG. 4 depicts a fully-differential amplifier 400 with the inverse paralleling linearization in a positive feedback loop path.

FIG. 4 depicts a fully-differential amplifier 400 with the inverse paralleling linearization in a positive feedback loop path.

The fully-differential amplifier 400 has a main operational amplifier op_amp, a feedback circuit including a first feedback resistor Rf1 and a second resistor Rf2, and a compensation circuit including a first compensation resistor Rc1 and a second compensation resistor Rc2. The main operational amplifier op_amp has a non-inverting input terminal '+', an inverting input terminal '−', a positive output terminal (Vout_p), and a negative output terminal (Vout_n). The amplified signal is (Vout_p−Vout_n). The first feedback resistor Rf1 is coupled between the positive output terminal (Vout_p) and the inverting input terminal '−' of the main operational amplifier op_amp, and the second feedback resistor Rf2 is coupled between the negative output terminal (Vout_n) and the non-inverting input terminal '+' of the main operational amplifier op_amp. The first compensation resistor Rc1 is coupled between the negative output terminal (Vout_n) and the inverting input terminal '−' of the main operational amplifier op_amp, and the second compensation resistor Rc2 is coupled between the positive output terminal (Vout_p) and the non-inverting input terminal '+' of the main operational amplifier op_amp. Inverse paralleling linearization is successfully performed on both the first and second feedback resistors Rf1 and Rf2.

In an exemplary embodiment, the resistance of the first compensation resistor Rc1 is greater than the resistance of the first feedback resistor Rf1, the size of the first compensation resistor Rc1 is smaller than the size of the first feedback resistor Rf1, the resistance of the second compensation resistor Rc2 is greater than the resistance of the second feedback resistor Rf2, and the size of the second compensation resistor Rc2 is smaller than the size of the second feedback resistor Rf2.

In an exemplary embodiment, the resistance of the first compensation resistor Rc1 is N times the resistance of the first feedback resistor Rf1, and N is greater than 1. The length and width of the first feedback resistor Rf1 are L1 and W1, respectively. The length and width of the first compensation resistor Rc1 are L2 and W2, respectively. L2 is $L1/\sqrt{N}$ and W2 is $W1/(N\cdot\sqrt{N})$. The size of the second feedback resistor Rf2 may be equal the size of the first feedback resistor Rf1. The size of the second compensation resistor Rc2 may be equal the size of the first compensation resistor Rc1.

In the other exemplary embodiments, the feedback resistors Rf1 and Rf2 are also manufactured in a small size. For example, the feedback resistor Rf1/Rf2 may be implemented by multiple small-sized resistors which are coupled in parallel.

In some exemplary embodiments, the inverse paralleling linearization architecture may be implemented in a feed-forward signal path rather than based on feedback of the amplifier.

Figure 5:
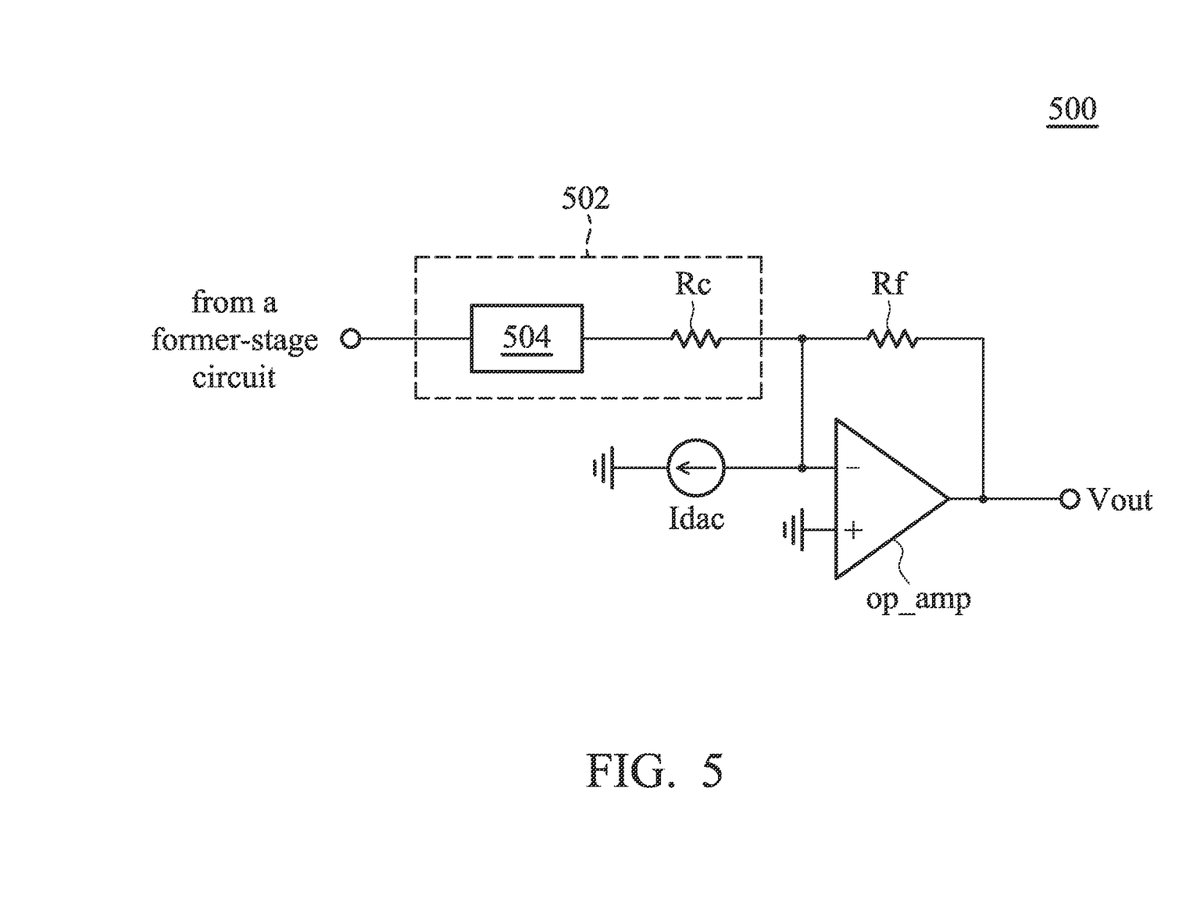
FIG. 5 depicts a single-ended amplifier 500 with the inverse paralleling linearization in a feed-forward signal path.

FIG. 5 depicts a single-ended amplifier 500 with the inverse paralleling linearization in a feed-forward signal path. In comparison with the single-ended amplifier 300 of FIG. 3, the compensation circuit 502 of the single-ended amplifier 500 is coupled between a former-stage circuit of the single-ended amplifier 500 and the inverting input terminal '−' of the main operational amplifier op_amp.

In an exemplary embodiment, the former-stage circuit provides the single-ended amplifier 500 with a current signal Idac as an input signal of the single-ended amplifier 500. In addition to the compensation resistor Rc, the compensation circuit 502 further has a converter 504 that converts the input signal Idac of the single-ended amplifier 500 to an inverted signal compared to the output signal Vout of the single-ended amplifier 500. In an exemplary embodiment, the converter 504 generates a voltage (≈−Iout*Rf=−Vout) to be coupled to the inverting input terminal '−' of the main operational amplifier op_amp through the compensation circuit Rc.

In this structure shown in FIG. 5, inverse paralleling linearization is successfully performed in a feed-forward signal path. The resistance of the compensation resistor Rc is greater than the resistance of the feedback resistor Rf, and the size of the compensation resistor Rc is smaller than the size of the feedback resistor Rf. In an exemplary embodiment, the resistance of the compensation resistor Rc is N times the resistance of the feedback resistor Rf, and N is greater than 1. The length and width of the feedback resistor Rf are L1 and W1, respectively. The length and width of the compensation resistor Rc are L2 and W2, respectively. L2 is $L1/\sqrt{N}$ and W2 is $W1/(N \cdot \sqrt{N})$.

In another exemplary embodiment, the converter 504 further includes an amplification circuit with a gain, k, greater than 1. The inverted signal (≈−Iout*Rf=−Vout) is amplified k times and then coupled to the inverting input terminal '−' of the main operational amplifier op_amp through the compensation circuit Rc. In such an example, the resistance of the compensation resistor Rc is k*N times the resistance of the feedback resistor Rf, and N is greater than 1. Specifically, the design of the compensation resistor Rc is: $L2=L1/\sqrt{k \cdot N}$, and $W2=W1/(k \cdot N \cdot \sqrt{k \cdot N})$. The size of the compensation resistor Rc is further shrunk by k.

In the other exemplary embodiments, the feedback resistor Rf is also manufactured in a small size. For example, the feedback resistor Rf may be implemented by multiple small-sized resistors which are coupled in parallel.

Figure 6:
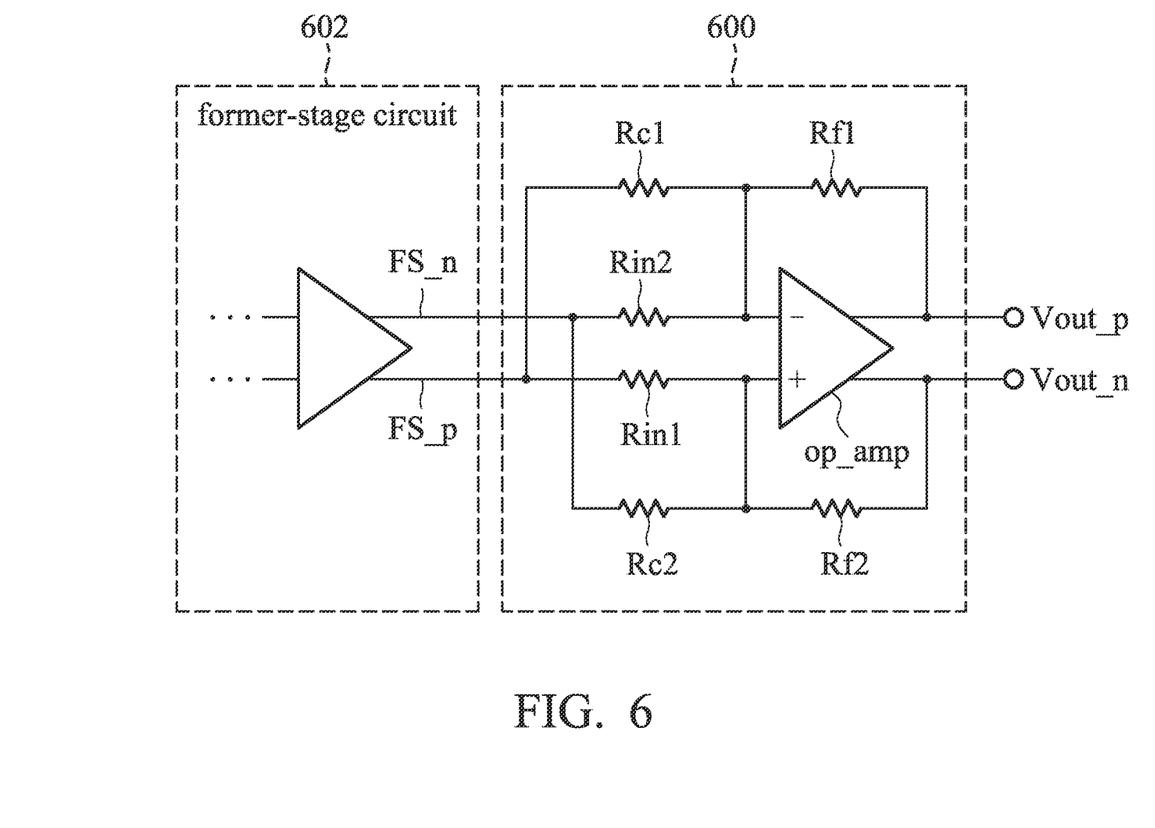
FIG. 6 depicts a fully-differential amplifier 600 with the inverse paralleling linearization in a feed-forward signal path.

FIG. 6 depicts a fully-differential amplifier 600 with the inverse paralleling linearization in a feed-forward signal path. In comparison with the single-ended amplifier 400 of FIG. 4, the first compensation resistor Rc1 is coupled between a positive output terminal FS_p of a former-stage circuit 602 of the fully-differential amplifier 600 and the inverting input terminal '−' of the main operational amplifier op_amp, and a second compensation resistor Rc2 is coupled between a negative output terminal FS_n of the former-stage circuit 602 of the fully-differential amplifier 600 and the non-inverting input terminal '+' of the main operational amplifier op_amp. The former-stage circuit 602 uses the positive and negative output terminals FS_p and FS_n to transfer a voltage signal into the fully-differential amplifier 600 as the input signal of the fully-differential amplifier 600. There is a first input resistor Rin1 coupled between the positive output terminal FS_p of the former-stage circuit 602 and the non-inverting input terminal '+' of the main operational amplifier op_amp, and a second input resistor Rin2 coupled between the negative output terminal FS_n of the former-stage circuit 602 and the inverting input terminal '−' of the main operational amplifier op_amp.

In this structure shown in FIG. 6, inverse paralleling linearization is successfully performed in a feed-forward signal path. The resistance of the first compensation resistor Rc1 is greater than the resistance of the first feedback resistor Rf1, the size of the first compensation resistor Rc1 is smaller than the size of the first feedback resistor Rf1, the resistance of the second compensation resistor Rc2 is greater than the resistance of the second feedback resistor Rf2, and the size of the second compensation resistor Rc2 is smaller than the size of the second feedback resistor Rf2.

In an exemplary embodiment, the resistance of the first compensation resistor Rc1 is N times the resistance of the first feedback resistor Rf1, and N is greater than 1. The length and width of the first feedback resistor Rf1 are L1 and W1, respectively. The length and width of the first compensation resistor Rc1 are L2 and W2, respectively. L2 is $L1/\sqrt{N}$ and W2 is $W1/(N \cdot \sqrt{N})$. The size of the second feedback resistor Rf2 may equal the size of the first feedback resistor Rf1. The size of the second compensation resistor Rc2 may equal the size of the first compensation resistor Rc1.

In the other exemplary embodiments, the feedback resistors Rf1 and Rf2 are also manufactured in a small size. For example, the feedback resistor Rf1/Rf2 may be implemented by multiple small-sized resistors which are coupled in parallel.

There may be various modifications of the amplifier architecture. Any amplifier with a compensation circuit coupled to the input port of the main operational amplifier to compensate for the non-linearity of the feedback circuit should be considered within the scope with the present invention. A signal coupled to the input port of the main operational amplifier through the compensation circuit has an inverse phase compared to the output signal of the main operational amplifier.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An amplifier, comprising:
a main operational amplifier;
a feedback circuit, coupling an output signal of the main operational amplifier to an input port of the main operational amplifier; and
a compensation circuit, coupling a former-stage circuit of the amplifier to the input port of the main operational amplifier to compensate for non-linearity of the feedback circuit,
wherein:
the compensation circuit and the feedback circuit form an inverse paralleling linearization architecture;
in the inverse paralleling linearization architecture, a resistor in the feedback circuit corresponds to a resistor in the compensation circuit which is biased in an inversed way in comparison with the corresponding resistor in the feedback circuit.

2. The amplifier as claimed in claim 1, wherein:
the main operational amplifier has a non-inverting input terminal, an inverting input terminal, a positive output terminal, and a negative output terminal, the non-inverting input terminal of the main operational amplifier is coupled to a positive output terminal of the former-stage circuit of the amplifier, and the inverting input terminal of the main operational amplifier is coupled to a negative output terminal of the former-stage circuit of the amplifier;

the feedback circuit includes a first feedback resistor coupled between the positive output terminal and the inverting input terminal of the main operational amplifier, and a second feedback resistor coupled between the negative output terminal and the non-inverting input terminal of the main operational amplifier; and the compensation circuit includes a first compensation resistor coupled between the positive output terminal of the former-stage circuit of the amplifier and the inverting input terminal of the main operational amplifier, and a second compensation resistor coupled between the negative output terminal of the former-stage circuit of the amplifier and the non-inverting input terminal of the main operational amplifier.

3. The amplifier as claimed in claim 2, wherein:

resistance of the first compensation resistor is greater than resistance of the first feedback resistor; and resistance of the second compensation resistor is greater than resistance of the second feedback resistor.

4. The amplifier as claimed in claim 3, wherein:

a size of the first compensation resistor is smaller than a size of the first feedback resistor; and a size of the second compensation resistor is smaller than a size of the second feedback resistor.

5. The amplifier as claimed in claim 2, wherein:

resistance of the first compensation resistor is N times resistance of the first feedback resistor, and N is greater than 1;

a length and a width of the first feedback resistor are L1 and W1, respectively;

a length and a width of the first compensation resistor are L2 and W2, respectively; and L2 is $L1/\sqrt{N}$ and W2 is $W1/(N \cdot \sqrt{N})$.

6. The amplifier as claimed in claim 5, wherein:

size of the second feedback resistor equals size of the first feedback resistor; and size of the second compensation resistor equals size of the first compensation resistor.

7. The amplifier as claimed in claim 3, further comprising:

a first input resistor, coupled between the positive output terminal of the former-stage circuit of the amplifier and the non-inverting input terminal of the main operational amplifier; and a second input resistor, coupled between the negative output terminal of the former-stage circuit of the amplifier and the inverting input terminal of the main operational amplifier.

8. The amplifier as claimed in claim 1, wherein:

the main operational amplifier has a non-inverting input terminal, an inverting input terminal, and a single-ended output terminal;

the feedback circuit includes a feedback resistor coupled between the single-ended output terminal and the inverting input terminal of the main operational amplifier; and the compensation circuit includes a compensation resistor coupled between the former-stage circuit of the amplifier and the inverting input terminal of the main operational amplifier.

9. The amplifier as claimed in claim 8, wherein:

resistance of the compensation resistor is greater than resistance of the feedback resistor.

10. The amplifier as claimed in claim 9, wherein:

a size of the compensation resistor is smaller than a size of the feedback resistor.

11. The amplifier as claimed in claim 8, wherein:

the former-stage circuit provides the amplifier with an input signal of the amplifier, and the compensation circuit converts the input signal of the amplifier to an inverted signal of a signal at the single-ended output terminal of the main operational amplifier and couples the inverted signal to the inverting input terminal of the main operational amplifier through the compensation resistor;

resistance of the compensation resistor is N times resistance of the feedback resistor, and N is greater than 1;

a length and a width of the feedback resistor are L1 and W1, respectively;

a length and a width of the compensation resistor are L2 and W2, respectively; and L2 is $L1/\sqrt{N}$ and W2 is $W1/(N \cdot \sqrt{N})$.

12. The amplifier as claimed in claim 8, wherein:

the compensation circuit further includes an amplification circuit with a gain k, and k is greater than 1;

the former-stage circuit provides the amplifier with an input signal of the amplifier, and the compensation circuit converts the input signal of the amplifier to an inverted signal of a signal at the single-ended output terminal of the main operational amplifier and couples the inverted signal to the amplification circuit, and an output terminal of the amplification circuit is coupled to the inverting input terminal of the main operational amplifier through the compensation resistor;

resistance of the compensation resistor is k*N times resistance of the feedback resistor, and N is greater than 1;

a length and a width of the feedback resistor are L1 and W1, respectively;

a length and a width of the compensation resistor are L2 and W2, respectively; and L2 is $L1/\sqrt{k \cdot N}$ and $W2 = W1/(k \cdot N \cdot \sqrt{k \cdot N})$.

* * * * *